United States Patent
Yu et al.

(10) Patent No.: US 9,224,760 B2
(45) Date of Patent: Dec. 29, 2015

(54) ARRAY SUBSTRATE AND FABRICATION METHOD THEREOF, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Haifeng Yu, Beijing (CN); Bin Feng, Beijing (CN); Xiaopeng Cui, Beijing (CN); Hongtao Lin, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/348,652
(22) PCT Filed: Jun. 13, 2013
(86) PCT No.: PCT/CN2013/077177
§ 371 (c)(1),
(2) Date: Mar. 31, 2014
(87) PCT Pub. No.: WO2014/166153
PCT Pub. Date: Oct. 16, 2014

(65) Prior Publication Data
US 2015/0162347 A1 Jun. 11, 2015

(30) Foreign Application Priority Data
Apr. 10, 2013 (CN) .......................... 2013 1 0123359

(51) Int. Cl.
*H01L 27/12* (2006.01)
*G09G 3/36* (2006.01)
*H01L 21/768* (2006.01)

(52) U.S. Cl.
CPC ............ *H01L 27/124* (2013.01); *G09G 3/3677* (2013.01); *H01L 21/768* (2013.01);
(Continued)

(58) Field of Classification Search
CPC ......... H01L 21/66; H01L 21/77; H01L 21/88; H01L 27/12; H01L 27/146; H01L 27/1251; H01L 27/1255; H01L 27/0296
USPC ............ 257/59, 72, 239, E21.611, 614, 29.27
See application file for complete search history.

(56) References Cited

U.S. PATENT DOCUMENTS

| 5,929,829 A | 7/1999 | Pitt | |
|---|---|---|---|
| 2006/0103620 A1* | 5/2006 | Joo et al. ......................... | 345/98 |

(Continued)

FOREIGN PATENT DOCUMENTS

| CN | 1529197 A | 9/2004 |
|---|---|---|
| CN | 101201520 B | 9/2010 |

(Continued)

OTHER PUBLICATIONS

First Chinese Office Action Appln. No. 201310123359.3; Dated Feb. 12, 2015.

(Continued)

*Primary Examiner* — Michael Lebentritt
(74) *Attorney, Agent, or Firm* — Ladas & Parry LLP

(57) ABSTRACT

Embodiments of the invention provide an array substrate, a fabrication method thereof, and a display device. The array substrate includes a first conductive pattern connecting with a low level potential, a second conductive pattern provided in a same layer as a STV signal line, and an insulating layer provided between the first conductive pattern and the second conductive pattern. The first conductive pattern, the insulating layer and the second conductive pattern have an overlapping region so as to form a storage capacitor. A conductive tip toward the second conductive pattern is formed at a position of the STV signal line that corresponds to the second conductive pattern.

18 Claims, 3 Drawing Sheets

(52) U.S. Cl.
CPC ........ *H01L27/1255* (2013.01); *H01L 27/1259* (2013.01); *G09G 2300/0408* (2013.01); *G09G 2300/0426* (2013.01); *G09G 2330/04* (2013.01)

(56) References Cited

U.S. PATENT DOCUMENTS

| | | | | |
|---|---|---|---|---|
| 2007/0096647 | A1* | 5/2007 | Choo et al. | 313/512 |
| 2009/0115741 | A1* | 5/2009 | Wang et al. | 345/173 |
| 2010/0110058 | A1* | 5/2010 | Moh et al. | 345/211 |
| 2010/0328280 | A1* | 12/2010 | Wu | 345/206 |
| 2011/0043511 | A1* | 2/2011 | Hsueh et al. | 345/212 |
| 2011/0063278 | A1* | 3/2011 | Han | 345/212 |

FOREIGN PATENT DOCUMENTS

| | | |
|---|---|---|
| CN | 201828747 U | 5/2011 |
| KR | 1020070104088 A | 10/2007 |

OTHER PUBLICATIONS

Written Opinion of the International Searching Authority Dated Jan. 7, 2014; PCT/CN2013/077177.

International Search Report for PCT/CN2013/077177 dated Jan. 16, 2014.

Second Chinese Office Action dated Jun. 16, 2015, Appln. No. 201310123359.3.

* cited by examiner

US 9,224,760 B2

ARRAY SUBSTRATE AND FABRICATION METHOD THEREOF, AND DISPLAY DEVICE

TECHNICAL FIELD

Embodiments of the invention relate to an array substrate and a fabrication method thereof, and a display device.

BACKGROUND

With the development of thin film transistor liquid crystal display (TFT-LCD) technology, the competition among TFT-LCD products is increasingly fierce. The manufacturers constantly attempt new technologies to reduce the cost of their products and to improve the competitiveness of their products. Gate Driver on Array (GOA) technology is a typical representative of these new technologies.

In the GOA technology, a gate switching circuit is integrated on an array substrate so that the gate driver IC can be omitted. Thereby, the material cost can be reduced and the fabrication process can be simplified, and accordingly the product cost can be reduced. In the GOA technology, a signal line of STV (scan driver start vertical pulse) is only connected with the GOA unit of first line (or the GOA units of first few lines). Once electrostatic charges accumulate in the STV signal line, the STV signal line cannot release the electrostatic charges like other signal lines. The first GOA unit may be damaged if the electrostatic charges accumulated in the STV signal line reach a great amount, and thus electrical defect occurs.

A conventional structure for preventing the electrostatic charges from accumulating in the STV signal line is as follows: the STV signal line is connected with a capacitor prior to a connection position of the STV signal line and the GOA unit; and the electrostatic charges are released by a breakdown current generated under a high voltage. As shown in FIG. 1, the capacitor is formed of a gate metal layer that is used to form the STV signal line, a source-drain metal layer that is used to form a $V_{SS}$ signal line and a gate insulating layer. However, in the case of using the above-mentioned conventional structure, signal attenuation may occur due to the charge storage characteristic of the capacitor, which will result in an abnormal display.

SUMMARY OF THE INVENTION

An embodiment of the invention provides an array substrate. The array substrate comprises a first conductive pattern connecting with a low level potential, a second conductive pattern provided in a same layer as a STV signal line, and an insulating layer provided between the first conductive pattern and the second conductive pattern. The first conductive pattern, the insulating layer and the second conductive pattern have an overlapping region so as to form a storage capacitor. A conductive tip toward the second conductive pattern is formed at a position of the STV signal line that corresponds to the second conductive pattern.

An embodiment of the invention further provides a display device. The display device comprises the above-mentioned array substrate.

An embodiment of the invention further provides a method for fabricating an array substrate. The array substrate comprises a first conductive pattern connecting with a low level potential, a second conductive pattern provided in a same layer as a STV signal line, and an insulating layer provided between the first conductive pattern and the second conductive pattern. The first conductive pattern, the insulating layer and the second conductive pattern have an overlapping region so as to form a storage capacitor. The method comprises: forming a conductive tip toward the second conductive pattern at a position of the STV signal line that corresponds to the second conductive pattern.

DESCRIPTION OF THE EMBODIMENTS

Figure 1:
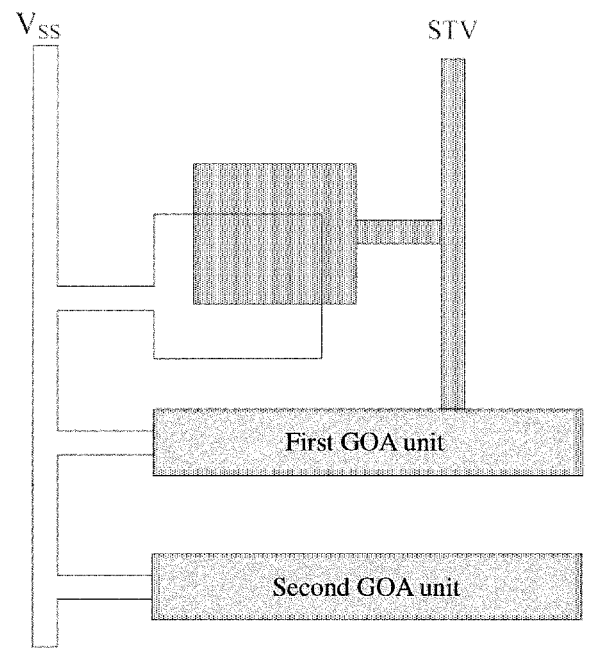
FIG. 1 is a schematic view illustrating a structure for preventing electrostatic charges from accumulating in a STV signal line in the conventional GOA circuit.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The embodiments of the invention provide an array substrate, a fabrication method thereof and a display device, which can effectively release electrostatic charges accumulated in the STV signal line without degrading the display effect.

An array substrate according to an embodiment of the invention comprises: a first conductive pattern connecting with a low level potential, a second conductive pattern provided in a same layer as a STV signal line, and an insulating layer provided between the first conductive pattern and the second conductive pattern. The first conductive pattern, the insulating layer and the second conductive pattern have an overlapping region so as to form a storage capacitor. A conductive tip toward the second conductive pattern is formed at a position of the STV signal line that corresponds to the second conductive pattern.

The array substrate according to the embodiment of the invention may be of either a top gate type or a bottom gate type. In the case that the array substrate according to the embodiment of the invention is of the top gate type, the first conductive pattern may be formed by a gate metal layer, the second conductive pattern and the STV signal line may be formed by a source-drain metal layer, the insulating layer may be formed by a gate insulating layer, the first conductive pattern, the insulating layer and the second conductive pattern have the overlapping region so as to form the storage capacitor and the conductive tip may be formed by the source-drain metal layer. In the case that the array substrate according to the embodiment of the invention is of the bottom gate type, the first conductive pattern may be formed by the source metal layer, the second conductive pattern and the STV signal line may be formed by the gate metal layer, the insulating layer may be formed by the gate insulating layer, the first conductive pattern, the insulating layer and the second conductive pattern have the overlapping region so as to form the storage capacitor and the conductive tip may be formed by the gate metal layer.

Further, the array substrate according to the embodiment of the invention is not limited to form the insulating layer of the storage capacitor by the gate insulating layer. Any insulating layer provided between the first conductive pattern and the second conductive pattern may be used to form the insulating layer of the storage capacitor as well.

Further, the array substrate according to the embodiment of the invention is not limited to be a horizontal-electric-field-type array substrate. The array substrate according to the embodiment of the invention may be a vertical-electric-field-type array substrate as well, as long as the storage capacitor is formed by the first conductive pattern connecting with the low level potential and the second conductive pattern disposed in the same layer as the STV signal line.

Further, in the case that the first conductive pattern is formed by the source-drain metal layer, the first conductive pattern, and a source electrode and a drain electrode of the array substrate may be simultaneously formed through a same patterning process. In the case that the second conductive pattern, the conductive tip and the STV signal line are formed by the gate metal layer, the second conductive pattern, the conductive tip, the STV signal line, and a gate electrode line and a gate line of the array substrate may be simultaneously formed through a same patterning process. Thus, the array substrate according to the embodiment of the invention can be achieved without increasing the number of the patterning processes.

Further, by taking the case that the array substrate according to the embodiment of the invention is of the bottom gate type as an example, the array substrate according to the embodiment of the invention comprises: a substrate; the second conductive pattern, the conductive tip, the STV signal line, the gate electrode and the gate line, which are formed on the substrate by the gate metal layer; the gate insulating layer, which is provided on the substrate on which the second conductive pattern, the conductive tip, the STV signal line, the gate electrode and the gate line have been formed; the first conductive pattern, the source electrode and the drain electrode, which are formed on the gate insulating layer by the source-drain metal layer.

An embodiment of the invention further provides a method for fabricating the above-mentioned array substrate. The array substrate comprises: a first conductive pattern connecting with a low level potential, a second conductive pattern provided in a same layer as a STV signal line, and an insulating layer provided between the first conductive pattern and the second conductive pattern. The first conductive pattern, the insulating layer and the second conductive pattern have an overlapping region so as to form a storage capacitor. The method comprises: forming a conductive tip toward the second conductive pattern at a position of the STV signal line that corresponds to the second conductive pattern.

The array substrate according to the embodiment of the invention may be of either a top gate type or a bottom gate type. In the case that the array substrate according to the embodiment of the invention is of the top gate type, the first conductive pattern may be formed by a gate metal layer, the second conductive pattern and the STV signal line may be formed by a source-drain metal layer, the insulating layer may be formed by a gate insulating layer, the first conductive pattern, the insulating layer and the second conductive pattern have the overlapping region so as to form the storage capacitor and the conductive tip may be formed by the source-drain metal layer. In the case that the array substrate according to the embodiment of the invention is of the bottom gate type, the first conductive pattern may be formed by the source metal layer, the second conductive pattern and the STV signal line may be formed by the gate metal layer, the insulating layer may be formed by the gate insulating layer, the first conductive pattern, the insulating layer and the second conductive pattern have the overlapping region so as to form the storage capacitor and the conductive tip may be formed by the gate metal layer.

Further, the array substrate according to the embodiment of the invention is not limited to form the insulating layer of the storage capacitor by the gate insulating layer. Any insulating layer provided between the first conductive pattern and the second conductive pattern may be used to form the insulating layer of the storage capacitor as well.

Further, the array substrate according to the embodiment of the invention is not limited to be a horizontal-electric-field-type array substrate. The array substrate according to the embodiment of the invention may be a vertical-electric-field-type array substrate as well, as long as the storage capacitor is formed by the first conductive pattern connecting with the low level potential and the second conductive pattern disposed in the same layer as the STV signal line.

Further, in the case that the first conductive pattern is formed by the source-drain metal layer, the first conductive pattern, and a source electrode and a drain electrode of the array substrate may be simultaneously formed through a same patterning process. In the case that the second conductive pattern, the conductive tip and the STV signal line are formed by the gate metal layer, the second conductive pattern, the conductive tip, the STV signal line, and a gate electrode line and a gate line of the array substrate may be simultaneously formed through a same patterning process. In the way, the method according to the embodiment of the invention can achieve the array substrate without increasing the number of the patterning process.

Further, by taking the case that the array substrate according to the embodiment of the invention is of the bottom gate type as an example, the fabrication method comprises: providing a substrate; forming the second conductive pattern, the conductive tip, the STV signal line, a gate electrode and a gate line by the gate metal layer on the substrate through a first patterning process; forming the gate insulating layer and an active layer pattern on the substrate which has underwent the first patterning process through a second patterning process; and forming the first conductive pattern, a source electrode and a drain electrode by the source-drain metal layer on the substrate which has underwent the second patterning process through a third patterning process. For example, a data line is further formed in the third patterning process.

Further, after the storage capacitor and conductive tip are formed, a pixel electrode of the array substrate may be further fabricated. In this case, the method comprises: forming an insulating layer comprising a via hole on the substrate which has underwent the third patterning process through a fourth patterning process; and forming the pixel electrode by a transparent conductive layer on the insulating layer through a fifth patterning process. The pixel electrode is connected to the drain electrode through the via-hole.

In the array substrate according to the embodiment of the invention, the first conductive pattern, the insulating layer and the second conductive pattern have the overlapping region so as to form the storage capacitor, and the conductive tip toward the second conductive pattern is formed at the position of the STV signal line that corresponds to the second conductive pattern. When the display device operates normally, the charges transmitted in the STV signal line are not input into the storage capacitor, and therefore the abnormal display does not occur. When a large amount of electrostatic charges are accumulated in the STV signal line, the electrostatic charges are released to the second conductive pattern through the conductive tip, so that the release of the electrostatic charges can be achieved. Therefore, the array substrate according to the embodiment of the invention can effectively release the electrostatic charges accumulated in the STV signal line without degrading the display effect.

Hereinafter, the array substrate according to the embodiment of the invention will be described in detail with reference to FIG. 2-FIG. 5.

Figure 2:
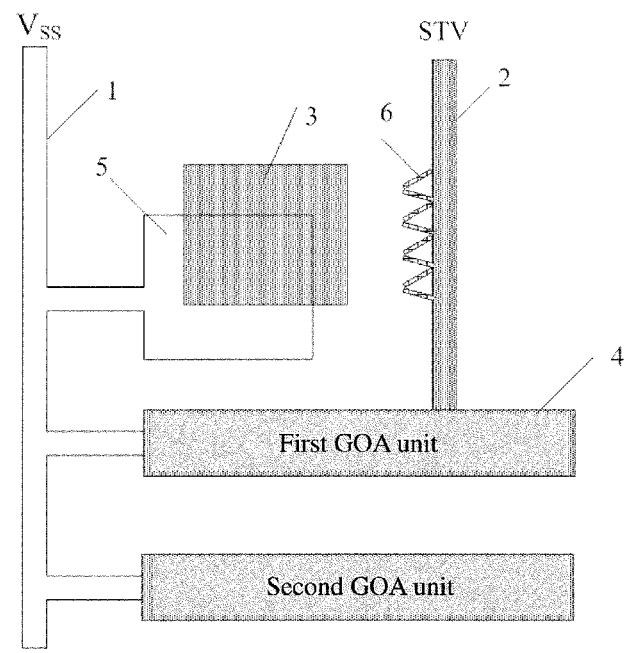
FIG. 2 is a schematic view illustrating a structure for preventing electrostatic charges from accumulating in a STV signal line in an array substrate according to an embodiment of the invention.

FIG. 2 is a schematic view illustrating a structure for preventing electrostatic charges from accumulating in the STV signal line in the array substrate according to the embodiment of the invention. As shown in FIG. 2, a $V_{SS}$ signal line 1 connecting with the low level potential is connected to the first conductive pattern 5, the second conductive pattern 3 and the first conductive pattern 5 are used to form the storage capacitor, and the STV signal line 2 is connected with the first GOA unit 4. Different from the conventional technology as shown in FIG. 1, the STV signal line 2 is not connected with the second conductive pattern 3 via a lead, and the conductive tip 6 is provided at the position of the STV signal line 2 that corresponds to the second conductive pattern 3, a tip of the conductive tip 6 is toward the second conductive pattern 3, and the conductive tip 6 is separated from the second conductive pattern 3.

Figure 3:
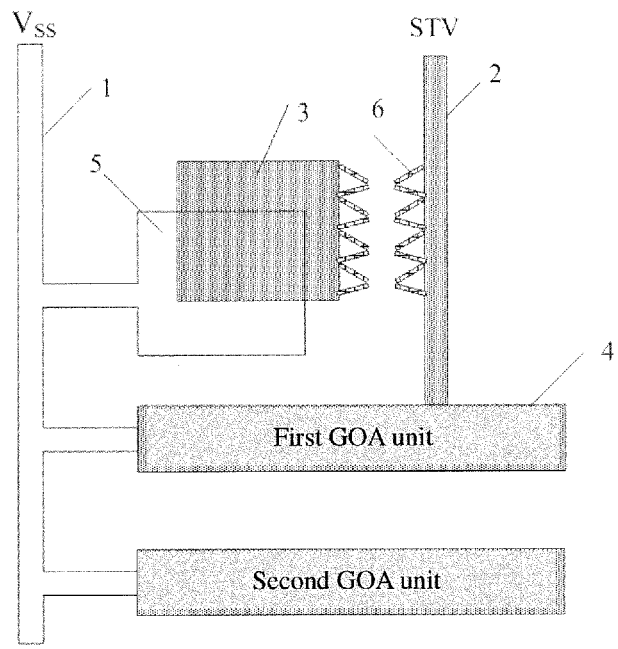
FIG. 3 is a schematic view illustrating another structure for preventing electrostatic charges from accumulating in the STV signal line in the array substrate according to an embodiment of the invention.

Further, in order to optimize the release efficiency of electrostatic charges, as shown in FIG. 3, another conductive tip may further be provided at a position of the second conductive pattern 3 that corresponds to the STV signal line 2. A tip of the another conductive tip connecting with the second conductive pattern 3 is toward the STV signal line 2.

Figure 4:
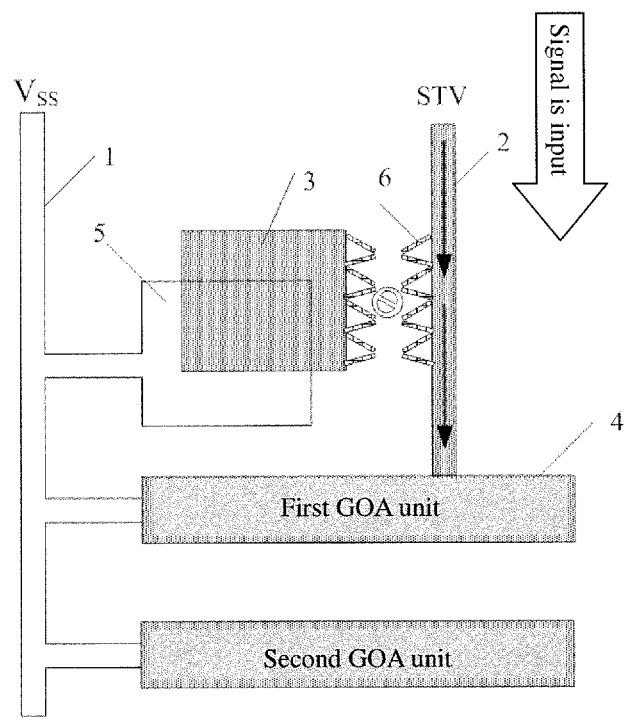
FIG. 4 is a schematic view illustrating a current state of the array substrate according to the embodiment of the invention when a signal is normally input.
Figure 5:
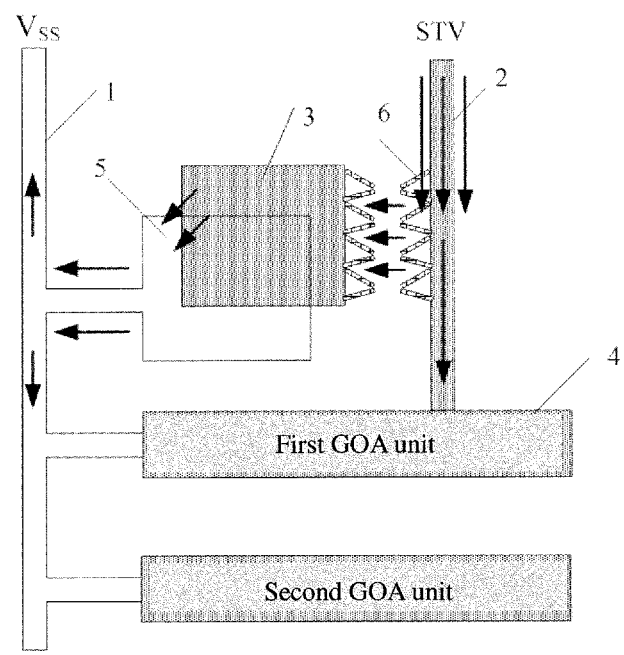
FIG. 5 is a schematic view illustrating that electrostatic charges are released by the array substrate according to the embodiment of the invention when electrostatic charges are accumulated.

As shown in FIG. 4, when the display device operates normally, the charges transmitted in the STV signal line are not input into the storage capacitor but flow into the first GOA unit 4. When a large amount of electrostatic charges are accumulated in the STV signal line 2, as shown in FIG. 5, the electrostatic charges are released to a lower plate electrode (i.e., the second conductive pattern 3) of the storage capacitor through the conductive tip 6, and subsequently the electrostatic charges flow into the $V_{SS}$ signal line 1 connecting with the low level potential through the storage capacitor, so that the release of the electrostatic charges can be achieved.

The array substrate according to the embodiment of the invention can effectively make use of the point discharge effect, and the conductive tip toward the second conductive pattern is formed at the position of the STV signal line that corresponds to the second conductive pattern. The array substrate according to the embodiment of the invention combines the conductive tip and the storage capacitor, and the conductive tip will not generate excessive RC load while achieving the effect of releasing electrostatic charges. When the display device operates normally, the charges transmitted in the STV signal line are not input into the storage capacitor, and therefore the abnormal display does not occur. When a large amount of electrostatic charges are accumulated in the STV signal line, the electrostatic charges are released to the second conductive pattern through the conductive tip. In a power-on state, the storage capacitor stores these electrostatic charges and then slowly releases the electrostatic charges; and in a power-off state, a breakdown current is generated in the storage capacitor with a high voltage so as to release the electrostatic charges. In this way, the release of the electrostatic charges can be achieved.

An embodiment of the invention further provides a display device. The display device comprises the above-mentioned array substrate. The display device may be: a liquid crystal display panel, an e-paper, an organic light emitting diode (OLED) panel, a liquid crystal display television (LCD TV), a liquid crystal display, a digital photo frame, a mobile phone, a tablet computer, or any other products or components having display function.

The foregoing embodiments merely are exemplary embodiments of the invention, and not intended to define the scope of the invention, and the scope of the invention is determined by the appended claims.

What is claimed is:

1. An array substrate, comprising a first conductive pattern connecting with a low level potential, a second conductive pattern provided in a same layer as a STV signal line, and an insulating layer provided between the first conductive pattern and the second conductive pattern, the first conductive pattern, the insulating layer and the second conductive pattern having an overlapping region so as to form a storage capacitor,
   wherein a conductive tip toward the second conductive pattern is formed at a position of the STV signal line that corresponds to the second conductive pattern.

2. The array substrate according to claim 1, wherein another conductive tip toward the STV signal line is formed at a position of the second conductive pattern that corresponds to the STV signal line.

3. The array substrate according to claim 1, wherein
   the first conductive pattern is formed by a source-drain metal layer; and
   the second conductive pattern, the conductive tip and the STV signal line are formed by a gate metal layer.

4. The array substrate according to claim 3, wherein
   the first conductive pattern, and a source electrode and a drain electrode of the array substrate are formed in a same layer; and
   the second conductive pattern, the conductive tip, the STV signal line, and a gate electrode and a gate line of the array substrate are formed in a same layer.

5. The array substrate according to claim 1, wherein
   the first conductive pattern is formed by a gate metal layer; and
   the second conductive pattern, the conductive tip and the STV signal line are formed by a source-drain metal layer.

6. The array substrate according to claim 5, wherein
   the first conductive pattern, and a gate electrode and a gate line of the array substrate are formed in a same layer; and
   the second conductive pattern, the conductive tip, the STV signal line, and a source electrode and a drain electrode of the array substrate are formed in a same layer.

7. A display device, comprising the array substrate according to claim 1.

8. A method for fabricating an array substrate, the array substrate comprising a first conductive pattern connecting with a low level potential, a second conductive pattern provided in a same layer as a STV signal line, and an insulating layer provided between the first conductive pattern and the second conductive pattern, the first conductive pattern, the insulating layer and the second conductive pattern having an overlapping region so as to form a storage capacitor, wherein the method comprises: forming a conductive tip toward the second conductive pattern at a position of the STV signal line that corresponds to the second conductive pattern.

9. The method for fabricating the array substrate according to claim 8, wherein the method further comprises: forming another conductive tip toward the STV signal line at a position of the second conductive pattern that corresponds to the STV signal line.

10. The method for fabricating an array substrate according to claim 8, wherein the method comprises: forming the first conductive pattern by a source-drain metal layer; and forming the second conductive pattern, the conductive tip and the STV signal line by a gate metal layer.

11. The method for fabricating the array substrate according to claim 10, wherein the method comprises: simultaneously forming the first conductive pattern, and a source electrode and a drain electrode of the array substrate by the source-drain metal layer through a same patterning process; and simultaneously forming the second conductive pattern, the conductive tip, the STV signal line, and a gate electrode and a gate line of the array substrate by the gate metal layer through a same patterning process.

12. The method for fabricating the array substrate according to claim 8, wherein the method comprises: forming the first conductive pattern by a gate metal layer, and forming the second conductive layer, the conductive tip and the STV signal line by a source-drain metal layer.

13. The method for fabricating the array substrate according to claim 12, wherein the method comprises: simultaneously forming the first conductive pattern, and a gate electrode and a gate line of the array substrate by the gate metal layer through a same patterning process; and simultaneously forming the second conductive pattern, the conductive tip, the STV signal line, and a source electrode and a drain electrode of the array substrate by the source-drain metal layer through a same patterning process.

14. The display device according to claim 7, wherein another conductive tip toward the STV signal line is formed at a position of the second conductive pattern that corresponds to the STV signal line.

15. The display device according to claim 7, wherein
the first conductive pattern is formed by a source-drain metal layer; and
the second conductive pattern, the conductive tip and the STV signal line are formed by a gate metal layer.

16. The display device according to claim 15, wherein
the first conductive pattern, and a source electrode and a drain electrode of the array substrate are formed in a same layer; and
the second conductive pattern, the conductive tip, the STV signal line, and a gate electrode and a gate line of the array substrate are formed in a same layer.

17. The display device according to claim 7, wherein
the first conductive pattern is formed by a gate metal layer; and
the second conductive pattern, the conductive tip and the STV signal line are formed by a source-drain metal layer.

18. The display device according to claim 17, wherein
the first conductive pattern, and a gate electrode and a gate line of the array substrate are formed in a same layer; and
the second conductive pattern, the conductive tip, the STV signal line, and a source electrode and a drain electrode of the array substrate are formed in a same layer.

* * * * *